(12) United States Patent
Kung et al.

(10) Patent No.: US 6,539,624 B1
(45) Date of Patent: Apr. 1, 2003

(54) METHOD FOR FORMING WAFER LEVEL PACKAGE

(75) Inventors: Ling-Chen Kung, Hsinchu (TW); Kuo-Chuan Chen, Hsinchu (TW); Ruoh-Huey Uang, Taipei (TW); Szu-Wei Lu, Hsin-Chu (TW)

(73) Assignee: Industrial Technology Research Institute, Chutung (TW)

( * ) Notice: Subject to any disclaimer, the term of this patent is extended or adjusted under 35 U.S.C. 154(b) by 0 days.

(21) Appl. No.: 09/277,797

(22) Filed: Mar. 27, 1999

(51) Int. Cl.[7] .................................................. H01K 9/00
(52) U.S. Cl. ........................ 29/843; 29/840; 29/832; 29/842; 29/876; 29/879
(58) Field of Search .......................... 29/840, 843, 830, 29/825, 832, 842, 876, 879; 438/614

(56) References Cited

U.S. PATENT DOCUMENTS 5,916,855 A * 6/1999 Avanzino .................... 51/307

6,365,501 B2 * 4/2002 Farworth .................... 438/614

\* cited by examiner

Primary Examiner—Carl J. Arbes
(74) Attorney, Agent, or Firm—Tung & Associates

(57) ABSTRACT

A method for forming a wafer level package that is equipped with solder balls on a top surface and encapsulated by a stress buffer layer of an elastomeric material is disclosed. The method can be carried by first forming a plurality of solder balls on bond pads provided on a top surface of a wafer and then forming an elastomeric material layer, or any other flexible, compliant material layer to encapsulate the solder balls. The tip portions of the solder balls is then substantially exposed by an etching process of either dry etching or wet etching such that the solder balls can be connected electrically to a circuit board. The present invention further provides a wafer level package that is formed with solder balls on a top surface encapsulated in an elastomeric material layer. The elastomeric material layer serves both as a stress buffer and a thermal expansion buffer such that the integrity and reliability of IC devices severed from the wafer can be maintained.

24 Claims, 3 Drawing Sheets

METHOD FOR FORMING WAFER LEVEL PACKAGE

FIELD OF THE INVENTION

The present invention generally relates to a method for forming a wafer level package and a device formed and more particularly, relates to a method for forming a wafer level package in which a plurality of solder balls are first formed on a plurality of bond pads before a layer of elastomeric material is formed on top of the wafer to encapsulate the plurality of solder balls with tip portions of the solder balls exposed for board level assembly and a device formed by the method.

BACKGROUND OF THE INVENTION

In the fabrication of modern semiconductor devices, the ever increasing device density and decreasing device dimensions demand more stringent requirements in the packaging or interconnecting techniques of such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become impractical for several reasons. One of the problems in utilizing solder paste screening technique in bonding modem semiconductor devices is the paste composition itself. A solder paste is formed by a flux material and solder alloy particles. The consistency and uniformity of the solder paste composition become more difficult to control as the solder bump volume decreases. Even though a solution of the problem has been proposed by using solder paste that contain extremely small and uniform solder particles, it can only be achieved at a high cost penalty. A second problem in utilizing the solder paste screening technique in modem high density semiconductor devices is the available space between solder bumps. It is known that a large volume reduction occurs when a solder changes from a paste state to a cured stated, the screen holes for the solder paste must be significantly larger in diameter than the actual solder bumps to be formed. The large volume shrinkage ratio thus makes the solder paste screening technique difficult to carry out in high density devices.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, the thin film electrodeposition technique which also requires a ball limiting metallurgy layer to be deposited and defined by an etching process which has the same limitations as the C4 technique. For instance, a conventional thin film electrodeposition process for depositing solder bumps is shown in FIGS. 1A~1F.

A conventional semiconductor structure 10 is shown in FIG. 1A. The semiconductor structure 10 is built on a silicon substrate 12 with active devices built therein. A bond pad 14 is formed on a top surface 16 of the substrate 12 for making electrical connections to the outside circuits. The bond pad 14 is normally formed of a conductive metal such as aluminum. The bond pad 14 is passivated by a final passivation layer 20 with a window 22 opened by a photolithography process to allow electrical connection to be made to the bond pad 14. The passivation layer 20 may be formed of any one of various insulating materials such as oxide, nitride or organic materials. The passivation layer 20 is applied on top of the semiconductor device 10 to provide both planarization and physical protection of the circuits formed on the device 10.

Onto the top surface 24 of the passivation layer 20 and the exposed top surface 18 of the bond pad 14, is then deposited an under bump metallurgy layer 26. This is shown in FIG. 1B. The under bump metallurgy (UBM) layer 26 normally consists of an adhesion/diffusion barrier layer 30 and a wetting layer 28. The adhesion/diffusion barrier layer 30 may be formed of Ti, TiN or other metal such as Cr. The wetting layer 28 is normally formed of a Cu layer or a Ni layer. The UMB layer 26 improves bonding between a solder ball to be formed and the top surface 18 of the bond pad 14.

In the next step of the process, as shown in FIG. 1C, a photoresist layer 34 is deposited on top of the UMB layer 26 and then patterned to define a window opening 38 for the solder ball to be subsequently formed. In the following electrodeposition process, a solder ball 40 is electrodeposited into the window opening 38 forming a structure protruded from the top surface 42 of the photoresist layer 34. The use of the photoresist layer 34 must be carefully controlled such that its thickness is in the range between about 30 $\mu$m and about 40 $\mu$m, preferably at a thickness of about 35 $\mu$m. The reason for the tight control on the thickness of the photoresist layer 34 is that, for achieving a fine-pitched solder bump formation, a photoresist layer of a reasonably small thickness must be used such that a high imaging resolution can be achieved. It is known that, during a photolithography process, the thicker the photoresist layer, the poorer is the imaging process. To maintain a reasonable accuracy in the imaging process on the photoresist layer 34, a reasonably thin photoresist layer 34 must be used which results in a mushroom configuration of the solder bump 40 deposited therein. The mushroom configuration of the solder bump 40 contributes greatly to the inability of a conventional process in producing fine-pitched solder bumps.

Referring now to FIG. 1E, wherein the conventional semiconductor structure 10 is shown with the photoresist layer 34 removed in a wet stripping process. The mushroom-shaped solder bump 40 remains while the under bump metallurgy layer 26 is also intact. In the next step of the process, as shown in FIG. 1F, the UBM layer 26 is etched away by using the solder bump 40 as a mask in an wet etching process. The solder bump 40 is then heated in a reflow process to form solder ball 42. The reflow process is conducted at a temperature that is at least the reflow temperature of the solder material.

In recent years, chip scale packages (CSP) have been developed as a new low cost packaging technique for high volume production of IC chips. One of such chip scale packaging techniques has been developed by the Tessera Company for making a so-called micro-BGA package. The micro-BGA package can be utilized in an environment where several of the packages are arranged in close proximity on a circuit board or a substrate much like the arrangement of individual tiles. Major benefits achieved by a micro-BGA package are the combined advantages of a flip chip assembly and a surface mount package. The chip scale packages can be formed in a physical size comparable to that of an IC chip even though, unlike a conventional IC chip such as a flip chip, the chip scale package does not require a special bonding process for forming solder balls. Furthermore, a chip scale package may provide larger number of input/output terminals than that possible from a conventional quad flat package, even though a typical quad flat package is better protected mechanically from the environment.

A unique feature of the chip scale package is the use of an interposer layer that is formed of a flexible, compliant material. The interposer layer provides the capability of absorbing mechanical stresses during the package forming steps and furthermore, allows thermal expansion mismatch between the die and the substrate. The interposer layer, therefore, acts both as a stress buffer and as a thermal expansion buffer. Another unique feature of the chip scale package, i.e., such as a micro-BGA package, is its ability to be assembled to a circuit board by using conventional surface mount technology (SMT) processes.

In a typical micro-BGA package, a flexible interposer layer (which may contain circuit) is used to interconnect bond pads on an IC chip to an array of solder bump connections located on a flexible circuit. The flexible circuit, normally of a thickness of approximately 25 $\mu$m, is formed of a polymeric material such as polyimide which is laminated to a silicon elastomer layer of approximately 150 $\mu$m thick. The silicon elastomeric layer provides flexibility and compliance in all three directions for relief of stresses and thermal expansion mismatches.

To further reduce the fabrication cost of IC devices, it is desirable that if a whole wafer can be passivated to seal the IC dies on the wafer, and then be severed into individual IC dies from the wafer such that not only the benefits of a chip scale package can be realized, the packaging cost for the IC dies may further be reduced.

It is therefore an object of the present invention to provide a method for forming a wafer level package for fabricating IC devices that does not have the drawbacks or the shortcomings of the conventional IC device fabrication techniques.

It is another object of the present invention to provide a method for forming a wafer level package that combines the benefits of chip scale packaging and low cost whole wafer packaging.

It is a further object of the present invention to provide a method for forming a wafer level package by first forming a plurality of solder balls on bond pads and then encapsulating the plurality of solder balls in a layer of compliant material.

It is another further object of the present invention to provide a method for forming a wafer level package by first forming a plurality of solder balls on bond pads and then coating a layer of elastomeric material on top of the wafer substantially encapsulating the plurality of solder balls.

It is still another object of the present invention to provide a method for forming a wafer level package by encapsulating a plurality of solder balls formed on a wafer surface and then thermally annealing an elastomeric material to improve its stress buffering characteristics.

It is yet another object of the present invention to provide a method for forming a wafer level package by first forming a plurality of solder balls encapsulated in an elastomeric layer and then etching the layer such that tip portions of the solder balls are substantially exposed for subsequent bonding in a board level assembly.

It is still another further object of the present invention to provide a wafer level package that has solder balls formed on top encapsulated in a layer of flexible, compliant material such as an elastomer as a buffering layer for mechanical stresses and thermal expansion mismatches.

It is yet another further object of the present invention to provide a wafer level package for low cost fabrication wherein solder balls and a stress buffering layer are sequentially formed on a wafer surface prior to the severing of individual IC dies from the wafer.

SUMMARY OF THE INVENTION

In accordance with the present invention, a method for forming a wafer level package and IC devices formed by the method are disclosed.

In a preferred embodiment, a method for forming a wafer level package can be carried out by first providing a pre-processed semi-conducting wafer that has a first plurality of bond pads formed on top and insulated by a passivation layer, depositing an electrically conductive layer on top of the wafer, defining and forming conductive lines in the conductive layer, forming a dielectric layer on top of the conductive lines, defining a second plurality of bond pads in the dielectric layer over the conductive lines, planting solder balls on the second plurality of bond pads, forming an elastic material layer on top of the wafer, and exposing tip portions of the solder balls by an etching step.

The method for forming a wafer level package may further include the step of increasing a height of the solder balls by a secondary solder ball planting process. The first plurality of bond pads may be situated along a peripheral edge of the IC dies on the wafer. The electrically conductive layer deposited on top of the wafer may be a metallic layer which has a thickness between about 2 $\mu$m and about 10 $\mu$m. The metallic layer may be formed of a metal selected from the group consisting of aluminum, copper, aluminum alloys and copper alloys. The conductive lines formed from the conductive layer may first be defined by a photolithographic process, and then formed by an etching process. The conductive lines may be formed as metal traces for extending the first plurality of bond pads located at a peripheral edge of the IC die to a central region of the die. The conductive lines may further be formed as metal traces for connecting the first plurality of bond pads into an area array on the surface of the IC dies.

In the method for forming a wafer level package, the dielectric material layer may be deposited by a technique selected from the group consisting of coating, printing and laminating. The dielectric material layer may be deposited to a thicknesses of between about 2 $\mu$m and about 20 $\mu$m. The dielectric material layer may be deposited of a material selected from the group consisting of polyimide, BCB (Benzocyclobutene) and other suitable polymeric materials. The second plurality of bond pads may be input/output pads that are defined by a photolithographic method. The method may further include the step of forming ball limiting metallurgy layers on the second plurality of bond pads prior to the planting of solder balls.

The method for forming a wafer level package may further include the step of depositing a ball limiting metallurgy layer on top of the wafer, and then defining the ball limiting metallurgy layer such that it only covers the second plurality of bond pads prior to the planting of the solder balls. The solder balls may be planted on the second plurality of bond pads by a technique selected from the group consisting of screen printing, electrodeposition, electroless deposition and stencil printing. The elastic material layer may be formed on top of the wafer to a thickness between about 50 μm and about 200 μm. The elastic material may be formed by a method of printing or coating. The elastic material may be an elastomer that includes silicone rubber. The method may further include the step of thermally annealing the elastic material layer until tip portions of the solder balls are exposed from the elastic material layer. The etching step for exposing tip portions of the solder may be carried out by a dry etching or a wet etching process.

In an alternate embodiment, the present invention method for forming a wafer level package with solder balls on top may be carried out by the operating steps of providing a pre-processed silicon wafer which has a first plurality of bond pads on top situated in a passivation layer, depositing a metal layer to a thickness of between about 2 μm and about 10 μm on top of the silicon wafer, defining metal traces in the metal layer by a photolithographic method, forming metal traces from the metal layer in an etching process, depositing a dielectric layer which has a thickness between about 2 μm and about 20 μm on top of the metal traces, defining a second plurality of bond pads in the dielectric layer over the metal traces by a photolithographic method, forming the second plurality of bond pads in an etching step over the metal traces, depositing a ball limiting metallurgy layer on top of the second plurality of bond pads, planting solder balls on the ball limiting metallurgy layer and the second plurality of bond pads by a technique selected from the group consisting of screen printing, electrodeposition, electroless deposition and stencil printing, depositing an elastomeric layer which has a thickness between about 50 μm and about 200 μm on top of the wafer surface, annealing under heat the elastomeric layer such that tip portions of the solder balls are exposed from the elastomeric layer, and exposing substantially tip portions of the solder balls by an etching step. The method may further include the step of increasing a height of the solder balls by a secondary solder balls planting process.

The present invention is further directed to a wafer level package which has solder balls formed on top that includes a pre-processed silicon wafer that has a first plurality of bond pads formed on top, the first plurality of bond pads are insulated by a passivation layer, a plurality of metal traces formed on top of the wafer providing electrical communication with the first plurality of bond pads, a dielectric layer deposited on top of the metal traces, a second plurality of bond pads formed in the dielectric layer over the metal traces in electrical communication with the first plurality of bond pads, a second plurality of solder balls formed on the second plurality of bond pads, and an elastomeric material substantially encapsulating the second plurality of solder balls with tip portions of the solder balls exposed for subsequent board level assembly.

In the wafer level package which has solder balls formed on top and encapsulated in a flexible layer, the elastomer layer may be formed of an elastomeric material that has an elasticity sufficient to buffer stresses imposed on the wafer during the solder ball forming process. The elastomeric material layer may be formed of an elastomer that includes silicone rubber and fluorosillicone rubber. The solder balls may have improved height by the planting of secondary solder balls on top. The metal traces may be formed of a metal of aluminum, copper, aluminum alloys or copper alloys. The dielectric layer may be deposited of polyimide or BCB.

BRIEF DESCRIPTION OF THE DRAWINGS

These objects, features and advantages will become apparent by the following specification and the appended drawings in which.

DETAILED DESCRIPTION OF THE PREFERRED AND ALTERNATE EMBODIMENTS

The present invention discloses a method for forming a wafer level package that is equipped with solder balls encapsulated in an elastomeric material layer on a top surface of the wafer and IC devices formed by such method.

The present invention method can be carried out by first forming a plurality of solder balls on a wafer on top of ball limiting metallurgy layers and bond pads, a flexible, compliant material is then deposited on the wafer surface to substantially encapsulate the solder balls and to function as a stress buffer and a thermal expansion mismatch buffer. The elastomeric material layer can be annealed at an elevated temperature to improve its physical characteristics and to planarize a top surface of the elastomer. In a final step of the process, the wafer surface is etched by either a wet etch or a dry etch process to substantially expose the tip portions of the solder balls such that they can be connected in the next level connection to a circuit board. The method may further include a secondary solder ball planting process in which the height of the solder balls can be increased by adding a second solder ball on top of the first solder ball built on the wafer. The process can be carried out photolithographically similar to that used in forming the first plurality of solder balls.

The invention further discloses a wafer level package which has solder balls formed on top and encapsulated in a flexible, compliant material layer such as an elastomer. The elastomer encapsulating layer acts as a mechanical stress buffer and a thermal expansion mismatch buffer. The mechanical strength of the solder balls can be significantly improved by the presence of the elastomeric material layer. The elastomeric material layer further helps to absorb the mechanical stresses during a subsequent scribing process in which IC dies are severed from the semiconductor wafer after wafer level packages are formed. In an alternate embodiment, the height of the solder balls can be increased by secondary solder balls that are built on top of the primary solder balls by a similar process of photoliography and ball planting.

Figure 1A:
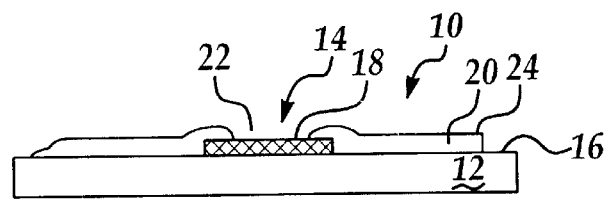
FIG. 1A is an enlarged, cross-sectional view of a conventional pre-processed semiconductor substrate which has a bond pad and a passivation layer formed on top.
Figure 1B:
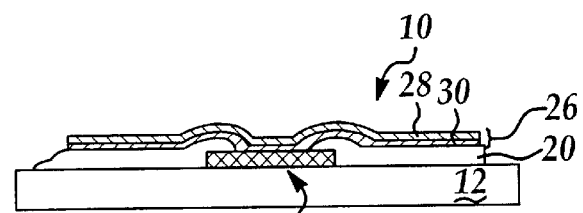
FIG. 1B is an enlarged, cross-sectional view of the conventional semiconductor structure of FIG. 1A which has a ball limiting metallurgy layer formed on top.
Figure 1C:
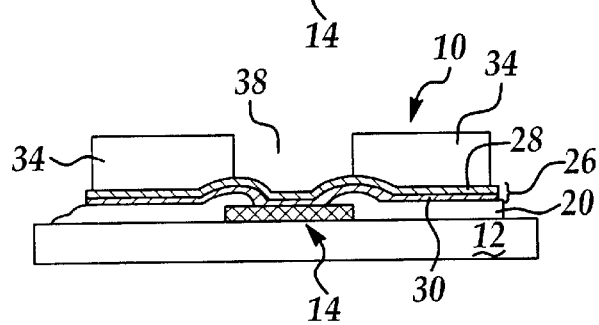
FIG. 1C is an enlarged, cross-sectional view of the conventional semiconductor structure of FIG. 1B with a photoresist layer deposited and defined on top.
Figure 1D:
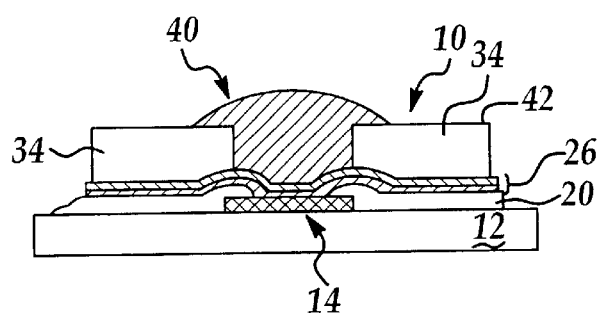
FIG. 1D is an enlarged, cross-sectional view of the conventional semiconductor structure of FIG. 1C with a solder material deposited in the window openings for the solder bump.
Figure 1E:
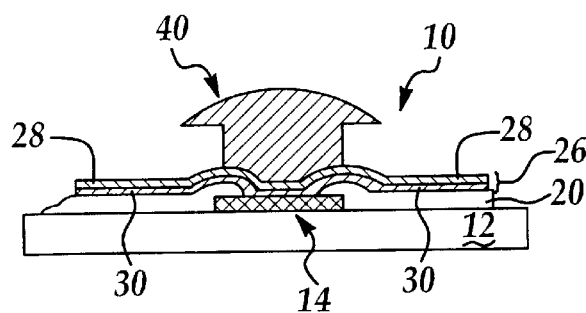
FIG. 1E is an enlarged, cross-sectional view of the conventional semiconductor structure of FIG. 1D with the photoresist layer removed in a wet etching process.
Figure 1F:
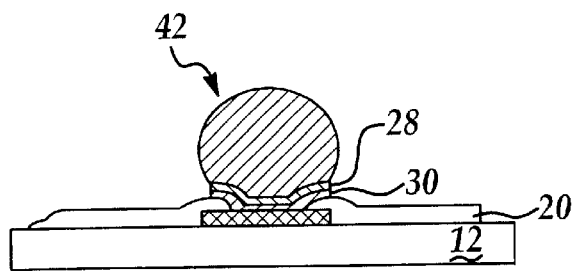
FIG. 1F is an enlarged, cross-sectional view of the conventional semiconductor structure of FIG. 1E with the exposed ball limiting metallurgy layer removed and the solder bump reflowed into a solder ball.
Figure 2A:
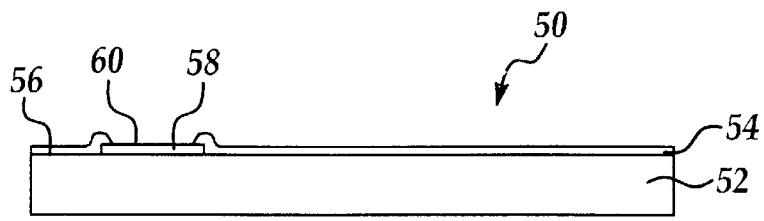
FIG. 2A is an enlarged, cross-sectional view of a present invention wafer that has a bond pad and a passivation layer formed on top.

Referring now to FIG. 2A wherein a present invention semi-conducting wafer 50 is shown. The semi-conducting wafer 50 is built on a silicon substrate 52 with a dielectric passivation layer 54 on a top surface 56 of the substrate. An electrically conductive bond pad 58 is encapsulated in the passivation layer 54 with a top surface 60 of the bond pad 58 exposed. The bond pad 58 may be formed of any suitable low resistance metal such as aluminum or copper.

Figure 2B:
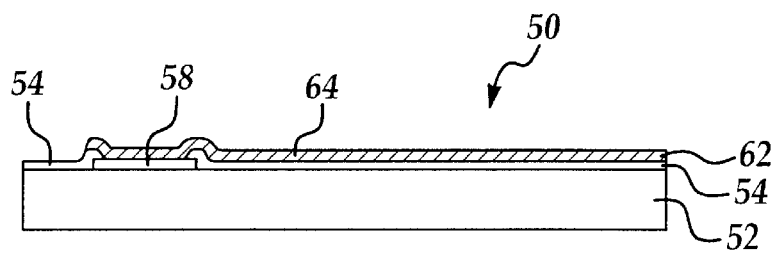
FIG. 2B is an enlarged, cross-sectional view of the present invention wafer of FIG. 2A that has a metal trace deposited and formed on top of the bond pad.

In the next step of the process, as shown in FIG. 2B, a suitable metal layer is deposited by a sputtering (or physical vapor deposition) process to a suitable thickness, i.e., between about 2 $\mu$m and about 10 $\mu$m. A metal layer 62 of aluminum, copper, aluminum alloy or copper alloy is formed by the process. The metal layer 62 is then patterned in a photolithographic method to cover only a bond pad 58 and forming a metal trace 64. The metal trace 64 can be formed by any suitable etching process for the metal used. The metal trace 64 formed advantageously provides electrically connection from bond pad 58 (an I/O pad) normally situated on a peripheral edge of an IC die to a central portion of an IC die (not shown). The metal trace 64 can further be used to provide electrical communication from I/O pad 58 located on the edge of the die to bond pads in an area array (not shown) on the die. A fan-in pattern may be suitably used for the metal trace 64.

Figure 2C:
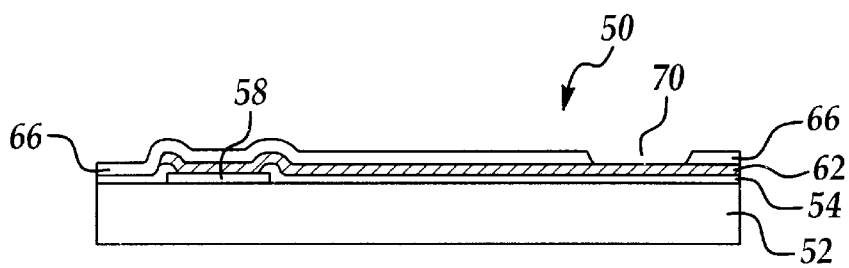
FIG. 2C is an enlarged, cross-sectional view of the present invention wafer of FIG. 2B that has a dielectric material layer deposited and patterned on top

A dielectric material layer 66 such as polyimide or BCB is then deposited on top of the metal trace 64, as shown in FIG. 2C. Any suitable deposition method such as spin coating, screen or stencil printing, or laminating can be used for the deposition of the dielectric material layer on top of the wafer 50. A suitable thickness for the dielectric material layer 66 is between about 2 $\mu$m and about 20 $\mu$m, and preferably between about 4 $\mu$m and about 10 $\mu$m. The dielectric material layer 66 used is preferably of the photosensitive type such that it can be patterned in a photolithographic process to define window 70 for an I/O pad.

Figure 2D:
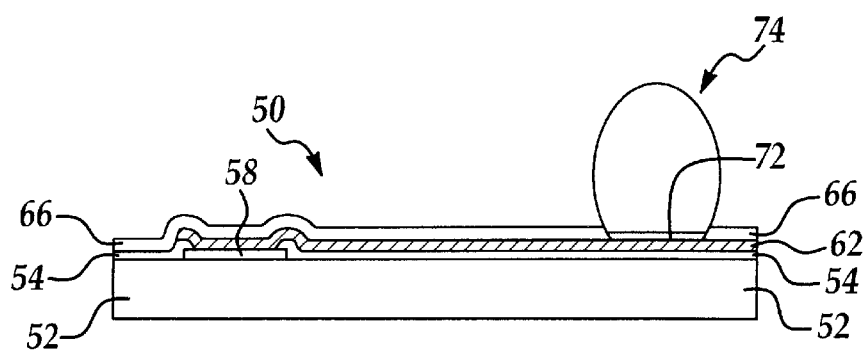
FIG. 2D is an enlarged, cross-sectional view of the present invention wafer of FIG. 2C with a ball limiting metallurgy layer deposited in a bond pad opening on the metal trace and a solder ball formed on top of the ball limiting metallurgy layer.
Figure 2E:
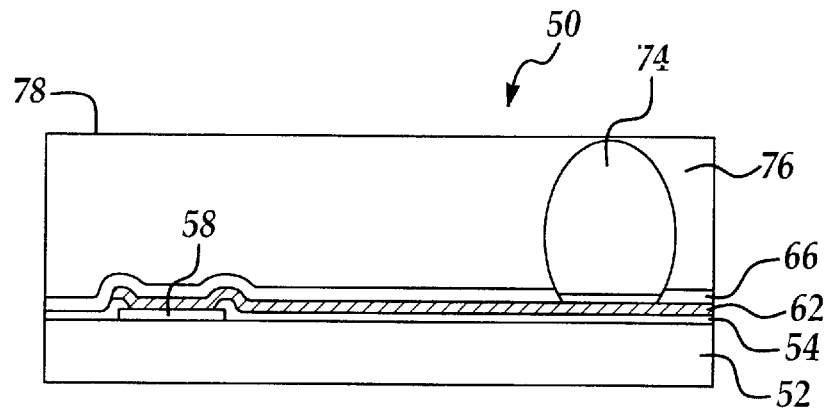
FIG. 2E is an enlarged, cross-sectional view of the present invention wafer of FIG. 2D that has a flexible, compliant material layer encapsulating the solder ball.

In the next step of the process, shown in FIG. 2D, a ball limiting metallurgy layer 72 is first deposited on top of the wafer 50 such that window 70 for the new I/O pad is covered. The ball limiting metallurgy (BLM) layer 72 can be advantageously deposited by an electroless plating technique or by a thin film deposition technique and then defined photolithographically for the bond pad. A plurality of solder balls 74 are then planted by any one of the conventional techniques such as screen printing, electrodeposition, electroless plating or stencil printing. The solder balls 74 are first deposited as solder bumps (not shown) in cavities formed in a photoresist layer (not shown), and then annealed into solder balls 74 after the photoresist layer is removed.

In the next step of the present invention novel method, a flexible, compliant material layer 76 is formed on top of the surface of wafer 50. The flexible, compliant material layer 76 may be formed by a suitable elastomeric material such as a silicone rubber or a fluorosilicone rubber. A suitable thickness for the elastomeric material layer 76 is similar to the total height of the solder ball 74 deposited. The flexible, compliant material layer 76 may be deposited by a printing or spin coating method. After the elastomeric material layer 76 is deposited on top of wafer 50, it may be heat cured to improve its physical characteristics and to provide a planarized top surface 78. It is preferred that the planarized top surface 78 is slightly below the tip of the solder ball 74 such that the tip is exposed.

Figure 2F:
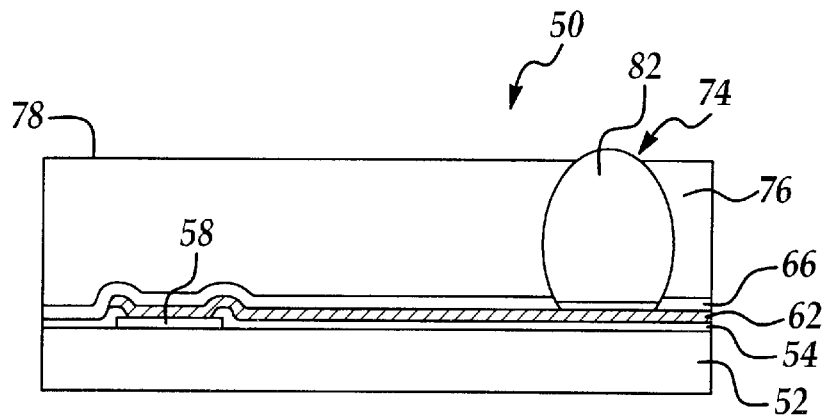
FIG. 2F is an enlarged, cross-sectional view of the present invention wafer of FIG. 2E after a curing/etch back process is conducted on the flexible compliant material layer.

An etching method of either dry etch or wet etch may be further used to expose the tip portion 82 of the solder ball 74 from the elastomeric material layer 76. This is shown in FIG. 2F. The tip portion 82 therefore provides electrical communication with a circuit board in the next level connection process for board level assembly.

In an alternate embodiment of the present invention method, a secondary solder ball planting process can be carried out such that a secondary solder ball 90 is planted on top of the first solder ball 74. This increases the height of the solder ball formed for applications wherein taller solder balls are required in a subsequent board level assembly process. The secondary solder ball 90 can be planted by a similar process as that used for planting the first solder ball 74, i.e., by a photolithographic method for forming cavities in a photoresist layer and then planting by a screen printing, electrodeposition, electroless deposition or stencil printing process.

Figure 3:
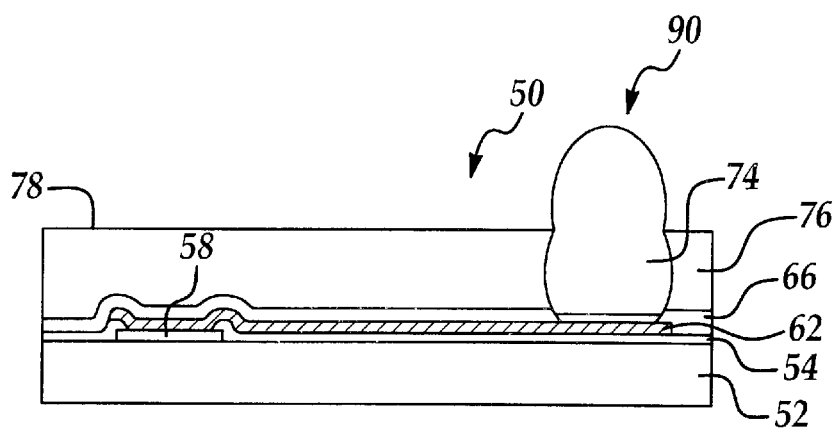
FIG. 3 is an enlarged, cross-sectional view of the present invention wafer of FIG. 2F with an improved height of the solder ball by a secondary solder ball planting process.

The present invention novel method and device formed have therefore been amply demonstrated in the above descriptions and in the appended drawings of FIGS. 2A~3. While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows:

What is claimed is:

1. A method for forming a wafer level package comprising the steps of:
   providing a pre-processed semi-conducting wafer having a first plurality of bond pads on a top surface insulated by a passivation layer, depositing an electrically conductive layer on said top surface of the wafer, defining and forming conductive lines in said conductive layer, forming a dielectric material layer on top of said conductive lines, defining a second pluralities of bond pads in said dielectric material layer over said conductive lines, planting solder balls on said second plurality of bond pads, forming an elastic material layer on said top surface of the wafer, and exposing tip portions of said solder balls in an etching step.

2. A method for forming a wafer level package according to claim 1 further comprising the step of increasing a height of said solder balls by a secondary solder ball planting process.

3. A method for forming a wafer level package according to claim 1, wherein said first plurality of bond pads are situated along a peripheral edge of IC dies on said wafer.

4. A method for forming a wafer level package according to claim 1, wherein said electrically conductive layer deposited on said top surface of the wafer is a metallic layer having a thickness between about 2 $\mu$m and about 10 $\mu$m.

5. A method for forming a wafer level package according to claim 4, wherein said metallic layer is formed of a metal selected the group consisting of aluminum, copper, aluminum alloys and copper alloys.

6. A method for forming a wafer level package according to claim 1, wherein said conductive lines formed from said conductive layer are defined by a photolithographic process.

7. A method for forming a wafer level package according to claim 1, wherein said conductive lines are formed from said conductive layer in an etching process.

8. A method for forming a wafer level package according to claim 1, wherein said conductive lines are formed as metal traces for extending the first plurality of bond pads from a peripheral edge of the IC dies to a central region of the dies.

9. A method for forming a wafer level package according to claim 1, wherein said conductive lines are formed as metal traces for connecting the first plurality of bond pads into an area array on the surface of the IC dies.

10. A method for forming a wafer level package according to claim 1, wherein said dielectric material layer is deposited by a technique selected from the group consisting of coating, printing and laminating.

11. A method for forming a wafer level package according to claim 1, wherein said dielectric material layer is deposited to a thickness between about 2 $\mu$m and about 20 $\mu$m.

12. A method for forming a wafer level package according to claim 1, wherein said dielectric material layer is deposited of a material selected from the group consisting of polyimide, BCB and other polymeric materials.

13. A method for forming a wafer level package according to claim 1, wherein said second plurality of bond pads defined are input/output pads.

14. A method for forming a wafer level package according to claim 1, wherein said second plurality of bond pads are defined by a photolithographic method.

15. A method for forming a wafer level package according to claim 1 further comprising the step of forming ball limiting metallurgy layer on said second plurality of bond pads prior to the planting of solder balls.

16. A method for forming a wafer level package according to claim 1 further comprising the step of depositing a ball limiting metallurgy layer on top of said wafer, and then defining said ball limiting metallurgy layer such that it covers said second plurality of bond pads prior to the planting of said solder balls.

17. A method for forming a wafer level package according to claim 1, wherein said solder balls are planted on said second plurality of bond pads by a technique selected from the group consisting of screen printing, electrodeposition, electroless deposition and stencil printing.

18. A method for forming a wafer level package according to claim 1, wherein said elastic material layer is formed on top of said wafer to a thickness between about 50 $\mu$m and about 200 $\mu$m.

19. A method for forming a wafer level package according to claim 1, wherein said elastic material layer is formed by a method of printing or coating.

20. A method for forming a wafer level package according to claim 1, wherein said elastic material layer is formed of an elastomer comprising silicone rubber or fluorosilicone rubber.

21. A method for forming a wafer level package according to claim 1 further comprising the step of thermal annealing said elastic material layer until tip portions of said solder balls are exposed from said elastic material layer.

22. A method for forming a wafer level package according to claim 1, wherein said etching step for exposing tip portions of said solder balls is carried out by a dry etching or wet etching process.

23. A method for forming a wafer level package with solder balls on top comprising the steps of:

providing a pre-processed silicon wafer having a first plurality of bond pads formed on top situated in a passivation layer, depositing a metal layer to a thickness between about 2 $\mu$m and about 10 $\mu$m on top of said silicon wafer, defining metal traces in said metal layer by a photolithographic method, forming metal traces from said metal layer in an etching process, depositing a dielectric layer having a thickness between about 2 $\mu$m and about 20 $\mu$m on top of said metal traces, defining a second plurality of bond pads in the dielectric layer over the metal traces by a photolithographic method, forming said second plurality of bond pads in an etching step over the metal traces, depositing a ball limiting metallurgy layer on top of said second plurality of bond pads, planting solder balls on said ball limiting metallurgy layer and said second plurality of bond pads by a technique selected from the group consisting of screen printing, electrodeposition, electroless deposition and stencil printing, depositing an elastomeric layer having a thickness between about 50 $\mu$m and about 200 $\mu$m on top of said wafer surface, annealing said elastomeric layer such that tip portions of said solder balls are exposed from said elastomeric layer, and exposing substantially tip portions of said solder balls by an etching process.

24. A method for forming a wafer level package with solder balls on a top surface according to claim 23 further comprising the step of increasing a height of the solder balls by a secondary solder ball planting process.

* * * * *